US009800750B2

(12) United States Patent
Lee

(10) Patent No.: US 9,800,750 B2
(45) Date of Patent: *Oct. 24, 2017

(54) POWER SAVING CONTROL METHOD AND APPARATUS EMPLOYING THE SAME

(71) Applicant: Samsung Electronics Co., Ltd., Suwon-si (KR)

(72) Inventor: Jae-sung Lee, Hwaseong-gun (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 43 days.

This patent is subject to a terminal disclaimer.

(21) Appl. No.: 14/607,917

(22) Filed: Jan. 28, 2015

(65) Prior Publication Data

US 2015/0146238 A1 May 28, 2015

Related U.S. Application Data

(63) Continuation of application No. 13/566,650, filed on Aug. 3, 2012, now Pat. No. 8,976,095, which is a
(Continued)

(30) Foreign Application Priority Data

Sep. 12, 2005 (KR) .................. 10-2005-0084769

(51) Int. Cl.
*G09G 5/14* (2006.01)
*H01L 27/32* (2006.01)
(Continued)

(52) U.S. Cl.
CPC .......... *H04N 1/00885* (2013.01); *G09G 5/14* (2013.01); *H04N 1/00408* (2013.01);
(Continued)

(58) Field of Classification Search
CPC ..... B41J 2/165; B41J 2/16547; H04N 1/0035; G09G 5/14; G09G 2360/04; H01L 27/3267
See application file for complete search history.

(56) References Cited

U.S. PATENT DOCUMENTS 5,832,190 A 11/1998 Terajima et al.
6,184,875 B1 2/2001 Matsuura
(Continued)

FOREIGN PATENT DOCUMENTS

EP 1122712 A1 8/2001
JP 2002344683 11/2002
(Continued)

OTHER PUBLICATIONS

U.S. Appl. No. 11/517,432—Non-Final Rejection dated Aug. 13, 2009.
(Continued)

*Primary Examiner* — Kevin M Nguyen
(74) *Attorney, Agent, or Firm* — Jefferson IP Law, LLP

(57) ABSTRACT

An apparatus and method for saving power in an office machine having a display panel are provided. The method comprises setting the apparatus in an operation standby mode, detecting whether an error exists in the apparatus and turning on the display panel to display the error thereon when the error is detected. Furthermore, the apparatus keeps the display panel in an off state when the error is not detected. Thus, the exemplary embodiments of the present invention provide a power saving method of an office machine which prevents unnecessary power consumption during an operation of an office machine having a display panel.

18 Claims, 3 Drawing Sheets

Related U.S. Application Data continuation of application No. 12/939,822, filed on Nov. 4, 2010, now Pat. No. 8,259,096, which is a continuation of application No. 11/517,432, filed on Sep. 8, 2006, now Pat. No. 7,855,721.

(51) Int. Cl.
 *H04N 1/00* (2006.01)
 *H04N 1/32* (2006.01)

(52) U.S. Cl.
 CPC ..... *H04N 1/00891* (2013.01); *H04N 1/00896* (2013.01); *H04N 1/00904* (2013.01); *H04N 1/32625* (2013.01); *H04N 1/32657* (2013.01); *G09G 2360/04* (2013.01); *H01L 27/3267* (2013.01); *H04N 2201/0082* (2013.01)

(56) References Cited

U.S. PATENT DOCUMENTS

| | | | |
|---|---|---|---|
| 6,226,472 B1 | 5/2001 | Yun | |
| 7,855,721 B2* | 12/2010 | Lee | H04N 1/00408 345/211 |
| 8,259,096 B2* | 9/2012 | Lee | H04N 1/00408 345/173 |
| 8,976,095 B2* | 3/2015 | Lee | H04N 1/00408 345/87 |
| 2001/0033308 A1* | 10/2001 | Fujimoto | B41J 2/16547 347/33 |
| 2002/0126113 A1 | 9/2002 | Iwasaki | |
| 2002/0141776 A1* | 10/2002 | Hirakawa | H04N 1/0035 399/81 |
| 2003/0128998 A1 | 7/2003 | Nishi | |
| 2004/0184059 A1 | 9/2004 | Chun et al. | |
| 2005/0012776 A1* | 1/2005 | Kato | B41J 2/165 347/23 |
| 2005/0147420 A1 | 7/2005 | Sawada et al. | |

FOREIGN PATENT DOCUMENTS

| | | |
|---|---|---|
| KR | 19980003967 | 3/1998 |
| KR | 19990019423 | 3/1999 |
| KR | 1020050035429 A | 4/2005 |

OTHER PUBLICATIONS

U.S. Appl. No. 11/517,432—Final Rejection dated Feb. 16, 2010.
U.S. Appl. No. 11/517,432—Notice of Allowance dated Aug. 13, 2010.
U.S. Appl. No. 12/939,822—Notice of Allowance dated May 4, 2012.

* cited by examiner

POWER SAVING CONTROL METHOD AND APPARATUS EMPLOYING THE SAME

CROSS-REFERENCE TO RELATED APPLICATIONS

This is a continuation application of U.S. patent application Ser. No. 13/566,650, filed on Aug. 3, 2012, which is a continuation of U.S. patent application Ser. No. 12/939,822, filed on Nov. 4, 2010, now U.S. Pat. No. 8,259,096, which is a continuation application of U.S. patent application Ser. No. 11/517,432, filed on Sep. 8, 2006, now U.S. Pat. No. 7,855,721, which claims the benefit under 35 U.S.C. §119(a) of Korean Patent Application No. 2005-0084769, filed on Sep. 12, 2005 in the Korean Intellectual Property Office, the entire disclosures of all of said prior applications being incorporated herein by reference.

BACKGROUND OF THE INVENTION

Field of the Invention

The present invention relates to a power-saving control method and a apparatus employing the same. More particularly, the present invention relates to an apparatus and method for saving power by driving a display panel in a power saving mode.

Description of the Related Art

Generally, an office machine may comprise a photocopier, a facsimile, a printer and the like. With the recent development of display technology, many office machines employ a display panel such as a liquid crystal display (LCD) panel to enhance a user's convenience.

Furthermore, such display panels are advancing in development in line with the advance of office machines.

However, office machines which employ a display panel such as the advanced LCD panel consume a large amount of power.

Also, the conventional office machines consume power unnecessarily as the display panel displays information even when the office machines operate normally.

Accordingly, there is a need for an improved apparatus and method for saving power in an office machine.

SUMMARY OF THE INVENTION

Exemplary embodiments of the present invention address at least the above problems and/or disadvantages and provide at least the advantages described below. Accordingly, it is an aspect of exemplary embodiments of the present invention to provide a apparatus and method for saving power which prevents unnecessary power consumption during an operation of an office machine having a display panel.

Additional aspects and/or advantages of exemplary embodiments of the present invention will be set forth in part in the description which follows and, in part, will be obvious from the description, or may be learned by practice.

The foregoing and/or other aspects of exemplary embodiments of the present invention are also achieved by providing an apparatus and method for saving power used by an office machine having a display panel, comprising setting the office machine in standby mode, detecting whether an error exists in the office machine, turning on the display panel to display the error thereon when the error is detected, and keeping the display panel in an off state when the error is not detected.

According to another aspect of exemplary embodiments of the present invention, there is further provided a display lamp to display a normal operation state of the office machine, wherein the display lamp is illuminated when the error is not detected.

According to another aspect of exemplary embodiments of the present invention, there is provided an apparatus and method for converting an office machine into a power saving mode when the office machine receives a request to be converted into the power saving mode, converting into an operation standby mode when the office machine receives a request to be converted into the operation standby mode, detecting whether an error exists in the office machine, turning on the display panel to display the error when the error is detected, and keeping the display panel in the off state when the error is not detected.

According to another aspect of exemplary embodiments of the present invention, the apparatus and method further comprise turning on the display panel according to a command input by a user.

BRIEF DESCRIPTION OF THE DRAWINGS

The above and/or other aspects and advantages of certain exemplary embodiments of the present invention will become apparent and more readily appreciated from the following description taken in conjunction with the accompanying drawings of which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness. Reference will now be made in detail to exemplary embodiments of the present invention, examples of which are illustrated in the accompanying drawings.

Figure 1:
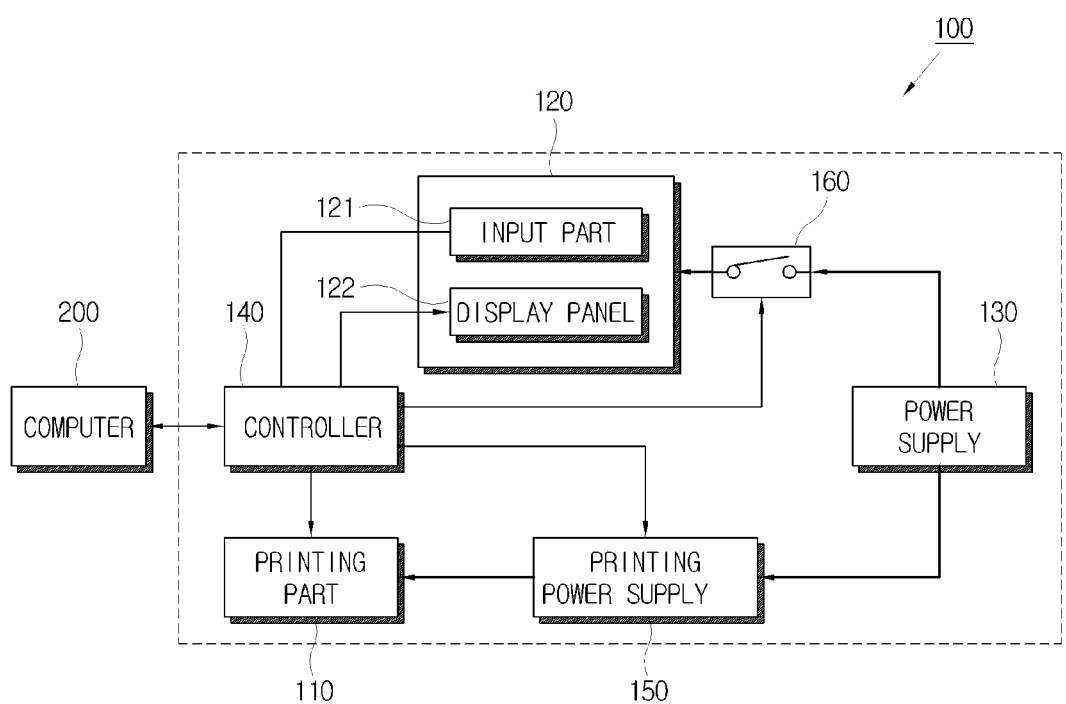
FIG. 1 is a block diagram of an office machine according to an exemplary embodiment of the present invention.

FIG. 1 is a block diagram of an image forming apparatus 100 according to an exemplary embodiment of the present invention. The exemplary image forming apparatus 100 may include a printer, a facsimile, a multifunction device or similar apparatus that forms an image on a printing media. However, the present invention is not limited to an apparatus that forms an image on a printing media.

The exemplary image forming apparatus 100 comprises a printing part 110 which performs a printing operation, a user interface 120 which displays an operation state of the image forming apparatus 100 and receives a command input from a user, a power supply 130 which supplies power to the printing part 110 and the user interface 120 and a controller 140 which controls the printing part 110 and the user interface 120.

The controller 140 controls power supplied to the printing part 110 through a printing power supply 150 which is provided between the printing part 110 and the power supply 130, and controls power supplied to the user interface 120 through a switch 160 which is provided between the user interface 120 and the power supply 130.

Furthermore, the controller 140 may be connected with an external computer 200 through a network.

The user interface 120 may comprise an input part 121 to which a user inputs a command and a display panel 122 which displays an operation state of the image forming apparatus 100. The user interface 120 may perform input and output functions with the display panel 122 by employing a touch screen and the like.

Printing data, which may be received from the computer 200, is converted into a printing command by the controller 140. The printing part 110 receives the printing command and performs the printing operation on a printing medium. Here, the controller 140 controls the display panel 122 of the user interface 120 to display a current operation state, in other words a printing operation state of the image forming apparatus 100.

Meanwhile, a method of saving power of the office machine according to the exemplary embodiment of the present invention is accomplished by on/off operations of the display panel 122 through on/off controls of the switch 160 by the controller 140. Details of the power saving method of the office machine will be described later.

Figure 2:
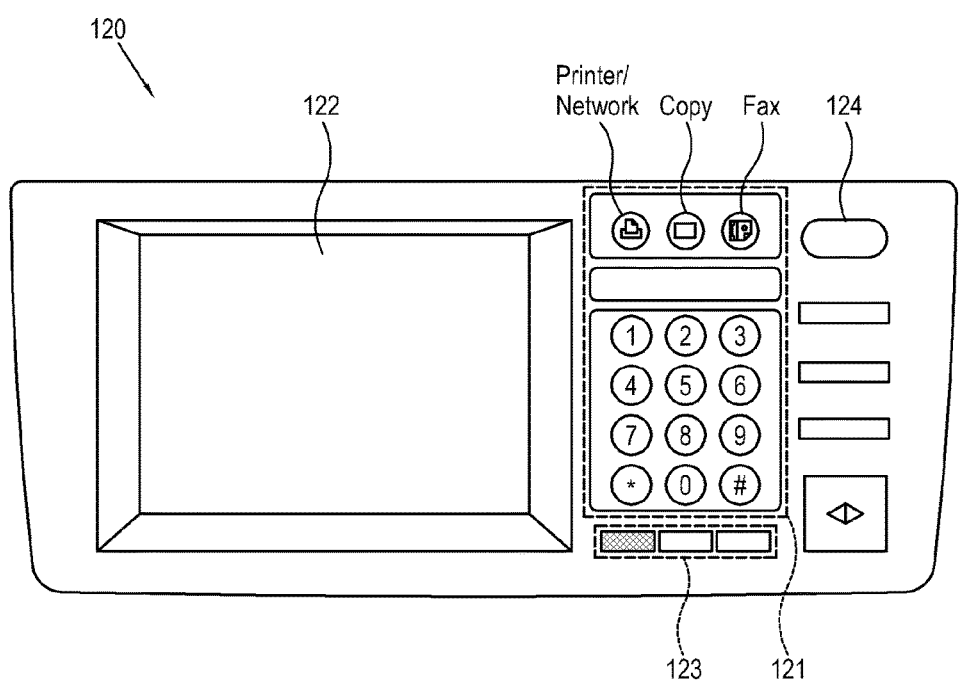
FIG. 2 is a plan view of an element of the exemplary office machine shown in FIG. 1.

FIG. 2 illustrates an external appearance of an exemplary user interface 120 of the image forming apparatus 100 shown in FIG. 1. The exemplary user interface 120 comprises the display panel 122 provided, for example, on a left side thereof as a touch screen and the input part 121 which is provided, for example, on a right side thereof and having a plurality of buttons. The user interface 120 further comprises a display lamp 123 such as one or more LEDs (light emitting diodes) to display a normal or abnormal state of the image forming apparatus 100 and a display panel power button 124 to selectively turn on and off the display panel 122 by a user. The display panel 122 may be turned on and off by an operation of the display panel power button 124 by a user, other than by control of the controller 140.

A user may input a command through the input part 121 or through the display panel 122 when a touch screen is provided as the display panel 122. Also, the display panel 122 displays the operation state of the image forming apparatus 100 through a display control of the controller 140.

Figure 3:
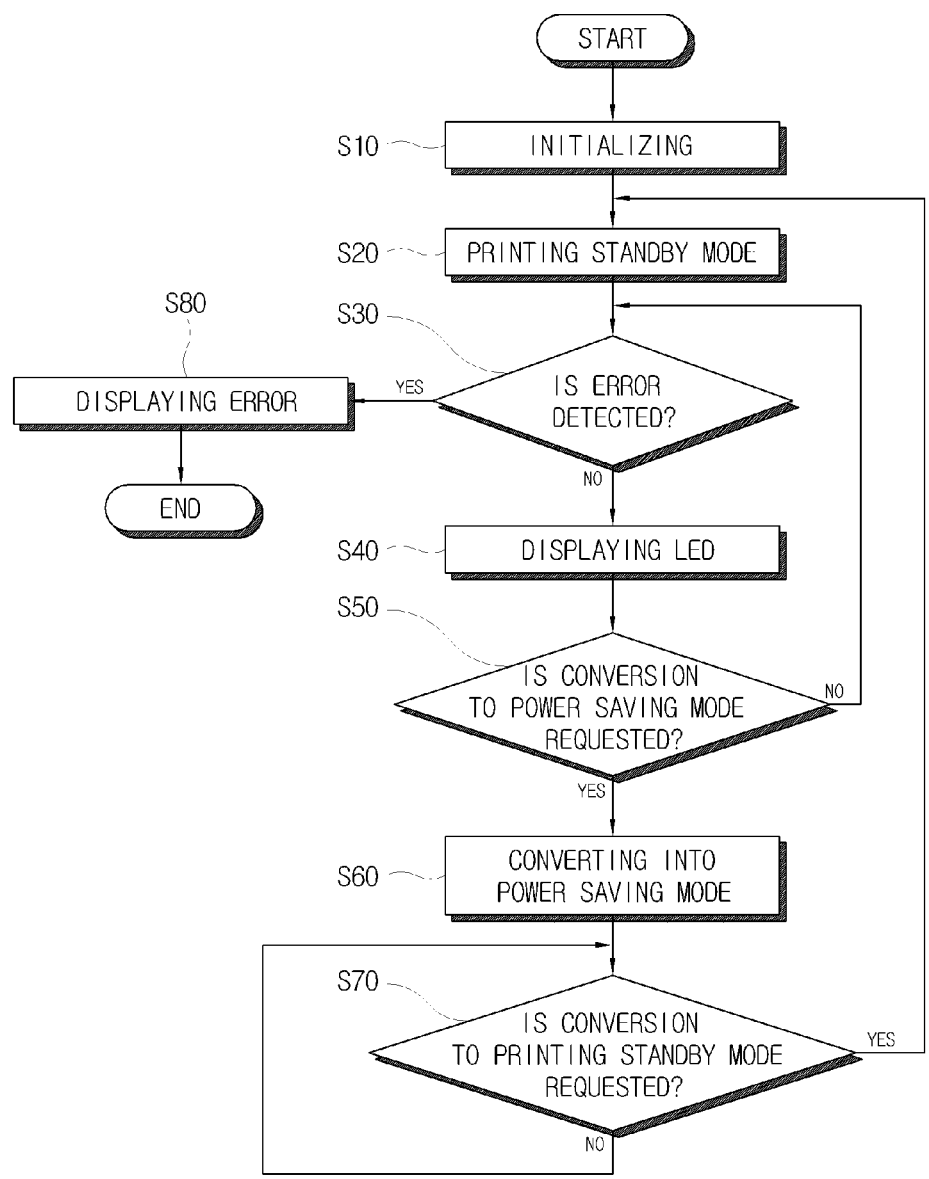
FIG. 3 is a control flowchart of a power-saving control method of an office machine according to an exemplary embodiment of the present invention.

FIG. 3 is a control flowchart illustrating an exemplary power-saving control method of the image forming apparatus 100 of FIG. 1.

First, the image forming apparatus 100 is initialized when receiving power (S10). The initialization may comprise trial operations of respective elements of the image forming apparatus 100 and removing of a latent image and toner remaining in the printing part 110. During the initialization (S10), the display 122 remains in an off state.

The image forming apparatus 100 is set in a printing standby mode through the initialization (S20). Here, in the printing standby mode, the image forming apparatus 100 is ready to immediately perform a printing operation. Typically, in the printing standby mode, the printing part 110 receives power so as to perform a printing operation as required.

In the printing standby mode, the controller 140 determines whether the respective elements of the image forming apparatus 100 have errors (S30). That is, the controller 140 checks for jams, printing paper, remaining toner, malfunction of the elements and the like.

When the controller 140 determines that there is no error, the controller 140 turns on the display lamp 123 only while the display panel 122 of the user interface 120 is turned off, to display the normal state of the image forming apparatus 100 (S40).

Conversely, when the controller 140 determines that there is an error, the controller 140 turns on the display panel 122 to display the corresponding error information thereon (S80).

Accordingly, the display panel 122 of the user interface 120 remains in an off state when the image forming apparatus 100 is initialized and when the apparatus operates normally. When the image forming apparatus 100 operates abnormally, the display panel 122 of the user interface 120 is converted into an on state to display the error information thereon.

If error information is displayed in S80, a user may respond properly to the error information displayed on the display panel 122.

Meanwhile, after the display lamp 123 is turned on, the image forming apparatus 100 is converted into a power saving mode when a printing operation is not performed for a period of time (S50 and S60). A program may be used to determine whether the period of time has passed. When the period of time has passed without a printing operation, the controller 140 may recognize it as a request for a conversion to the power saving mode (S50).

In the power saving mode (S60), the controller 140 reduces the power supplied to the printing part 110, thereby minimizing power consumption of the image forming apparatus 100. To convert from the power saving mode to the printing standby mode again, the printing part 110 may be preheated by receiving power at a normal level.

When the controller 140 receives a printing command through data transmission from the external computer 200 or through the user interface 120 by a user, the controller 140 determines to convert the image forming apparatus 100 into the printing standby mode (S70). Then, the image forming apparatus 100 is converted into the printing standby mode by the control of the controller 140 (S20).

In the printing standby mode, the image forming apparatus 100 detects for error again before performing the printing operation (S30). If an error is detected, the image forming apparatus 100 turns on the display 122 to display the detected error on the display panel 122 (S80). When the error is not detected, the image forming apparatus 100 turns on the display lamp 123 only while turning off the display panel 122, to perform the printing operation.

Meanwhile, a user may turn on the display panel 122 through the display panel power button 124 to check the operation state of the image forming apparatus 100.

In the exemplary embodiments of the present invention, the image forming apparatus 100 is provided as an example of the office machine, but the present invention is not limited thereto. Alternatively, the present invention may be applicable to various office machines having a display panel to save power through on/off controls of the display panel.

Although a few exemplary embodiments of the present invention have been shown and described, it will be appreciated by those skilled in the art that changes may be made in these embodiments without departing from the principles and spirit of the invention, the scope of which is defined in the appended claims and their full scope of equivalents.

What is claimed is:

1. A printing apparatus comprising:
a printing part configured to perform a printing operation;
a display panel;
an indicator lamp configured to indicate a state of the printing apparatus; and
a controller configured to:
transition from a power saving mode to a printing standby mode, when receiving printing data from an external device during the power saving mode,
control the display panel to maintain an off state during the printing standby mode, when the printing data is received from the external device during the power saving mode, and
control the indicator lamp to turn on only during the printing standby mode, the display panel is in the off state, and the printing apparatus is functioning normally.

2. The printing apparatus of claim 1, wherein, in the printing standby mode, when there is an error in the image forming apparatus, the controller is further configured to:
turn on the display panel, and
display a corresponding error information on the display panel.

3. The printing apparatus of claim 1, further comprising a plurality of input buttons,
wherein, when the display panel is in the off state during the printing standby mode, at least one of the input buttons is operable to turn on the display panel.

4. The printing apparatus of claim 1, wherein the indicator lamp is a light emitting diode.

5. An image forming apparatus comprising:
a printing part configured to perform a printing operation;
a user interface including:
a display panel, and
an indicator lamp configured to indicate a state of the image forming apparatus; and
a controller configured to control the printing part and the user interface,
wherein, when printing data is received during a power saving mode, the image forming apparatus transitions from the power saving mode to a printing standby mode, and the controller is further configured to:
control the printing part and the user interface such that the display panel is maintained in an off state, and
control the indicator lamp to turn on only during the printing standby mode, the display panel is in the off state, and the printing apparatus is functioning normally, and
wherein, during the printing standby mode, when the controller determines that there is an error in the image forming apparatus, the controller is further configured to:
turn on the display panel, and
display a corresponding error information on the display panel.

6. The image forming apparatus of claim 5, further comprising a plurality of input buttons,
wherein, when the display panel is in the off state during the printing standby mode, at least one of the input buttons is operable to turn on the display panel.

7. The image forming apparatus of claim 5, wherein the indicator lamp is a light emitting diode.

8. A method of providing status indication in a printing device, the method comprising:
receiving, when the printing device is in a power saving mode, print data;
transitioning, in response to receiving the print data, the printing device from the power saving mode to a printing standby mode by providing power to each element of the printing device while maintaining a display panel in an off state;
indicating, only when the printing device is in the printing standby mode, the display panel is in the off state, and the printing device's state is normal, the state of the printing device via at least one indicator lamp, the indicator lamp displaying whether the printing device operates under a normal state and an abnormal state; and
operating, when the printing device is in the standby mode and the printing device's state is abnormal, the display panel to display a status message.

9. The method of claim 8, further comprising:
receiving, when the printing device is in the standby mode and the display panel is in a power off state, a command to turn on the display panel via at least one of a plurality of buttons;
powering on the display panel; and
displaying the status of the printing device on the display panel.

10. The method of claim 8, wherein the indicating of the state of the printing device via the at least one indicator lamp further comprises ensuring the display panel remains powered off.

11. The method of claim 8, wherein the operating of the display panel to display the status message, further comprises:
powering on the display panel, and
displaying the status message corresponding to error information of the printing device on the display panel.

12. The method of claim 11, wherein the error information corresponds to one of jams, printing paper, remaining toner and malfunction of elements of the printing device.

13. A printing apparatus, comprising:
a printing part;
at least one indicator lamp;
a display panel; and
a controller configured to:
receive, in a power saving mode, print data,
transition, in response to receiving the print data, from the power saving mode to a printing standby mode by providing power to the printing part,
maintain, in response to receiving the print data, the display panel in a power off state,
indicate, only when in the printing standby mode, the display panel is in the power off state, and the printing apparatus's state is normal, the state of the printing part via the at least one indicator lamp, the indicator lamp displaying whether the printing apparatus operates under a normal state and an abnormal state, and
operate, when in the standby mode and the printing apparatus's state is abnormal, the display panel to display a status message.

14. The printer apparatus of claim 13, further comprising:
a plurality of buttons,
wherein, when in the standby mode and the display panel is in the power off state, the controller is further configured to:
receive a command to turn on the display panel via at least one of the plurality of buttons,
operate the display panel to be turned on, and
indicate a status of the printing apparatus via the display panel.

15. The printing apparatus of claim 13, wherein, when the at least one indicator lamp is indicating the state of the printing part, the controller is further configured to maintain the display panel in a power off state.

16. The printing apparatus of claim 13, wherein, when operating the display panel to display the status message, the controller is further configured to:

power on the display panel, and display the status message corresponding to error information of the printing apparatus on the display panel.

17. The printing apparatus of claim 16, wherein the error information corresponds to one of jams, printing paper, remaining toner and malfunction of elements of the printing device.

18. The printing apparatus of claim 13, wherein the at least one indicator lamp is a light emitting diode.

* * * * *